United States Patent
Hamada

(10) Patent No.: US 8,445,165 B2
(45) Date of Patent: May 21, 2013

(54) PELLICLE FOR LITHOGRAPHY

(75) Inventor: Yuichi Hamada, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 194 days.

(21) Appl. No.: 12/944,194

(22) Filed: Nov. 11, 2010

(65) Prior Publication Data

US 2011/0117482 A1    May 19, 2011

(30) Foreign Application Priority Data

Nov. 19, 2009   (JP) .................................. 2009-263986

(51) Int. Cl.
*G03F 1/64*   (2012.01)

(52) U.S. Cl.
USPC .......................................................... 430/4

(58) Field of Classification Search
USPC .......................................................... 430/4–5
See application file for complete search history.

(56) References Cited

U.S. PATENT DOCUMENTS

| 4,861,402 | A |  | 8/1989 | Gordon |  |
|---|---|---|---|---|---|
| 5,723,860 | A | * | 3/1998 | Hamada et al. | 430/4 |
| 2004/0137339 | A1 | * | 7/2004 | Zhang et al. | 430/5 |
| 2005/0243452 | A1 | * | 11/2005 | Gallagher et al. | 359/888 |
| 2007/0292775 | A1 | * | 12/2007 | Hamada | 430/5 |
| 2010/0323281 | A1 | * | 12/2010 | Sekihara | 430/5 |

FOREIGN PATENT DOCUMENTS

| JP | 58-219023 |  | 12/1983 |
|---|---|---|---|
| JP | 61-166548 |  | 7/1986 |
| JP | 63-27707 |  | 6/1988 |
| JP | 02-250055 |  | 10/1990 |
| JP | 9-68792 |  | 3/1997 |
| JP | 3089153 | B2 | 9/2000 |
| JP | 2003-057804 |  | 2/2003 |
| JP | 2007-333910 |  | 12/2007 |

* cited by examiner

*Primary Examiner* — Mark F Huff
*Assistant Examiner* — John S Ruggles
(74) *Attorney, Agent, or Firm* — Kratz, Quintos & Hanson, LLP

(57) ABSTRACT

A pellicle for lithography is provided that includes a pellicle frame provided with one or more atmospheric pressure adjustment holes having an inner peripheral face with a shape that opens out in going toward the inside of the pellicle frame. There is also provided a process for producing the pellicle for lithography, the process comprising a step of forming the pellicle for lithography and a step of spray-coating a pressure-sensitive adhesive composition from inside the pellicle frame.

9 Claims, 7 Drawing Sheets

PELLICLE FOR LITHOGRAPHY

BACKGROUND OF THE INVENTION

1. Field of the Invention

The present invention relates to a pellicle for lithography that is used as a debris shield for a lithographic mask when producing a liquid crystal display panel or a semiconductor device such as an LSI or a ULSI.

2. Description of the Related Art

In the production of a semiconductor such as an LSI or a ULSI or the production of a liquid crystal display panel, patterning is carried out by irradiating a semiconductor wafer or a liquid crystal master plate with light; if debris is attached to an exposure master plate used here, since the debris absorbs the light or bends the light, there are the problems that the replicated pattern is deformed, the edge becomes rough, or the background is stained black, thus impairing the dimensions, quality, appearance, etc. The 'exposure master plate' referred to in the present invention is a general term for lithographic masks and reticles.

These operations are usually carried out in a clean room, but even within a clean room it is difficult to always keep the exposure master plate clean, and a method is therefore employed in which a pellicle that allows exposure light to easily pass through is adhered to the surface of the exposure master plate to act as a debris shield.

In this case, the debris does not become attached directly to the surface of the exposure master plate but becomes attached to the pellicle film, and by focusing on a pattern of the exposure master plate when carrying out lithography the debris on the pellicle film does not become involved in the replication.

A pellicle is basically constituted from a pellicle frame and a pellicle film stretched over the frame. The pellicle film is formed from nitrocellulose, cellulose acetate, a fluorine-based polymer, etc., which allows exposure light (g rays, i rays, 248 nm, 193 nm, 157 nm, etc.) to easily pass through. The pellicle frame is formed from a black-anodized etc. A7075, A6061, A5052, etc. aluminum alloy, stainless steel, polyethylene, etc. The pellicle film is adhered by coating the upper part of the pellicle frame with a good solvent for the pellicle film and air-drying (ref. JP-A-58-219023 (JP-A denotes a Japanese unexamined patent application publication)) or by means of an adhesive such as an acrylic resin, an epoxy resin, or a fluorine resin (ref. U.S. Pat. No. 4,861,402, JP-B-63-27707 (JP-B denotes a Japanese examined patent application publication), and Japanese registered patent No. 3089153). Furthermore, since an exposure master plate is mounted on a lower part of the pellicle frame, a pressure-sensitive adhesion layer made of a polybutene resin, a polyvinyl acetate resin, an acrylic resin, a silicone resin, etc. and a reticle pressure-sensitive adhesive protecting liner for the purpose of protecting the pressure-sensitive adhesion layer are provided.

The pellicle is installed so as to surround a pattern region formed on the surface of the exposure master plate. Since the pellicle is provided in order to prevent debris from becoming attached to the exposure master plate, this pattern region and a pellicle outer part are separated so that dust from the pellicle outer part does not become attached to the pattern face.

The present applicant has disclosed a filter-equipped pellicle in which a filter that is to be provided on an atmospheric pressure adjustment hole is wetted with a pressure-sensitive adhesive (ref. JP-A-9-68792).

In particular, since the pellicle is used by affixing it directly to an exposure master plate, there is a desire for a low gas generation rate for materials forming the pellicle, that is, a reticle adhesive, a film adhesive, an inner wall coating agent, etc., which are formed from organic materials, and improvements have been made. Among them, as the reticle adhesive there is one that employs a silicone resin in order to give lower outgassing, improved UV resistance, and improved chemical resistance. Since silicone resins have excellent chemical stability, it is possible to fix a pellicle onto a reticle without there being any changes over a long period of time. However, when the pellicle is to be stripped from the reticle for replacement, it is difficult to carry out stripping well without leaving a residue on the reticle. As a method for stripping a pellicle that has a silicone adhesive, a method in which a substrate from which a pellicle is stripped is heated has been proposed (Patent Publication 1).

In recent years, the LSI design rule has shrunk to subquarter micron, and accompanying this the control of foreign matter has become tighter. There is also a demand for flushing with clean air a closed space formed by affixing a pellicle and then carrying out exposure, and the role of the atmospheric pressure adjustment hole of the pellicle frame has become all the more important.

As described in JP-A-9-68792 above, measures against foreign matter with respect to a filter provided on an atmospheric pressure adjustment hole have been proposed, but no measures taken have given a marked improvement for the pellicle frame atmospheric pressure adjustment hole itself.

BRIEF SUMMARY OF THE INVENTION

The above-mentioned object of the present invention has been attained by means <1> and <8> below. They are described together with <2> to <7>, which are preferred embodiments of the present invention.

<1> A pellicle for lithography comprising a pellicle frame provided with one or more atmospheric pressure adjustment holes having an inner peripheral face with a shape that opens out in going toward the inside of the pellicle frame, <2> the pellicle for lithography according to <1>, wherein the atmospheric pressure adjustment hole has a pressure-sensitive adhesive layer on the inner peripheral face, <3> the pellicle for lithography according to <1> or <2>, wherein the inner peripheral face of the atmospheric pressure adjustment hole has a shape that opens out so as to be continuous with the inside of the pellicle frame, <4> the pellicle for lithography according to any one of <1> to <3>, wherein the pellicle frame is provided on an outside face with a dust filter so as to cover the atmospheric pressure adjustment hole, <5> the pellicle for lithography according to any one of <1> to <4>, wherein the hole diameter of the atmospheric pressure adjustment hole on an inside face of the pellicle frame is larger than the hole diameter of the atmospheric pressure adjustment hole on an outside face of the pellicle frame, the hole diameter of the atmospheric pressure adjustment hole on the outside face of the pellicle frame being 0.5 to 2.0 mmφ, and the hole diameter of the atmospheric pressure adjustment hole on the inside face of the pellicle frame being 0.8 to 3.0 mmφ, <6> the pellicle for lithography according to any one of <1> to <5>, wherein the inclination angle of opening out in going toward the inside of the pellicle frame in the atmospheric pressure adjustment hole is 2° to 45°, <7> the pellicle for lithography according to any one of <1> to <6>, wherein the hole diameter of the atmospheric pressure adjustment hole at a cross-section that is perpendicular to the thickness direction of the pellicle frame is larger than the hole diameter of the atmospheric pressure adjustment hole on an outside face of the pellicle frame for at least 90% of the thickness direction of the pellicle frame, and <8> a process for producing a pellicle for lithography, the process comprising a step of forming the pellicle for lithography according to any one of <1> to <7>, and a step of spray-coating a pressure-sensitive adhesive composition from inside the pellicle frame.

EFFECTS OF THE INVENTION

In accordance with the present invention, it becomes possible to form a pressure-sensitive adhesive layer efficiently and more uniformly on an inner peripheral face of one or more atmospheric pressure adjustment holes due to the inner peripheral face of the atmospheric pressure adjustment hole provided in a pellicle frame having a shape that opens out in going toward the inside of the pellicle frame, thereby suppressing any increase in foreign matter accompanying atmospheric pressure variation.

EXPLANATION OF REFERENCE NUMERALS AND SYMBOLS

Figure 1:
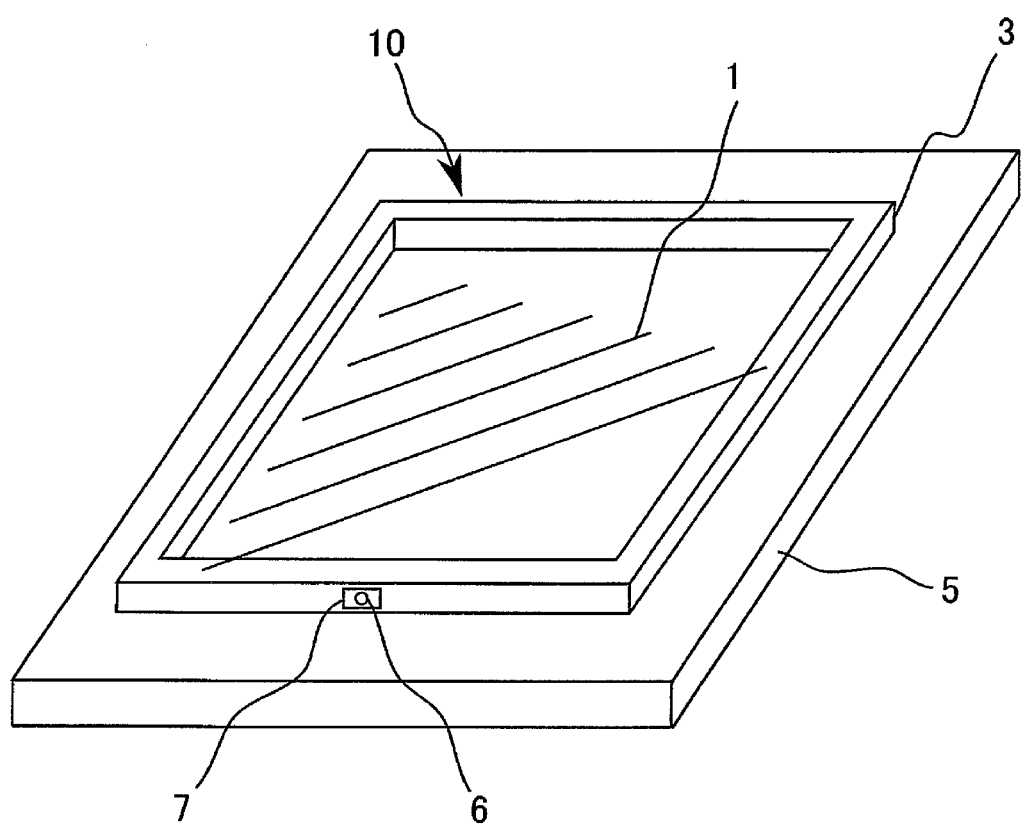
FIG. 1 is an outline perspective view schematically showing the overall constitution of the pellicle for lithography related to the present invention.

1: Pellicle film
3: Pellicle frame
5: Exposure master plate
6: Atmospheric pressure adjustment hole
7: Dust filter
10: Pellicle for lithography
θ: Aperture angle

DETAILED DESCRIPTION OF THE INVENTION

The pellicle for lithography of the present invention is characterized in that an inner peripheral face of one or more atmospheric pressure adjustment holes provided in a pellicle frame has a shape that opens out in going toward the inside of the pellicle frame. It is preferable that 90% or greater of the pellicle frame thickness has an opening-out shape, that is, the hole diameter of the atmospheric pressure adjustment hole at a cross-section perpendicular to the thickness direction of the pellicle frame is larger than the hole diameter of the atmospheric pressure adjustment hole on the outside face of the pellicle frame over 90% or greater in the thickness direction of the pellicle frame, and it is more preferable that it has an opening-out shape over the entire pellicle frame thickness. The 'opening-out shape' referred to here means that an angle θ formed by a tangent to the surface of the inner peripheral face of the atmospheric pressure adjustment hole with respect to a line perpendicular to the inside face of the pellicle frame is 2° or greater, and preferably 5° or greater. It is also preferably no greater than 45°.

Hereinafter, the pellicle for lithography is also called simply a 'pellicle', and the pellicle frame is also called simply a 'frame'.

The basic constitution of the pellicle for lithography related to the present invention is explained by reference to FIG. 1.

FIG. 1 is an outline view schematically showing an example of the basic constitution of the pellicle for lithography of the present invention. As shown in FIG. 1, a pellicle 10 for lithography in accordance with the present invention has a pellicle frame 3, which is for example a substantially rectangular framework body, and a pellicle film 1 stretched over an upper end face of the pellicle frame 3 via an adhesion layer for affixing it (not illustrated).

On a lower end face of the pellicle frame 3, there is formed a pressure-sensitive adhesion layer (not illustrated) for adhering the pellicle 10 to an exposure master plate (mask substrate or reticle) 5. A liner (not illustrated) is peelably affixed to a lower end face of the pressure-sensitive adhesion layer. This liner is peeled off when the pellicle 10 for lithography is adhered to the exposure master plate 5.

Furthermore, the pellicle frame 3 is provided with one or more atmospheric pressure adjustment holes (vents) 6 that extend through from its outside face to its inside face. The atmospheric pressure adjustment hole 6 is preferably provided with a dust filter 7 on the outside face for removing foreign matter so as to cover an aperture of the atmospheric pressure adjustment hole 6.

Furthermore, a resin coating is applied to the inside face of the pellicle frame 3 using a pressure-sensitive adhesive, thus forming an inside face pressure-sensitive adhesive layer (not illustrated).

The dimensions of these pellicle constituent members are similar to those of a normal pellicle, for example, a pellicle for semiconductor lithography, a pellicle for a lithographic step of large liquid crystal display panel production, etc., and the materials thereof may employ known materials.

The type of pellicle film 1 is not particularly limited as long as a beam of light having an exposure wavelength is transmitted and, for example, an amorphous fluorine polymer, etc. that has been used for a conventional excimer laser is used. Examples of the amorphous fluorine polymer include Cytop (product name, manufactured by Asahi Glass Co. Ltd.) and Teflon (Registered Trademark) AF (product name, manufactured by DuPont). These polymers may be used by dissolving them in a solvent as necessary when preparing the pellicle film, and may be dissolved as appropriate in, for example, a fluorine-based solvent.

Several embodiments of the pellicle related to the present invention are explained below by reference to FIGS. 2 to 6.

Figure 7:
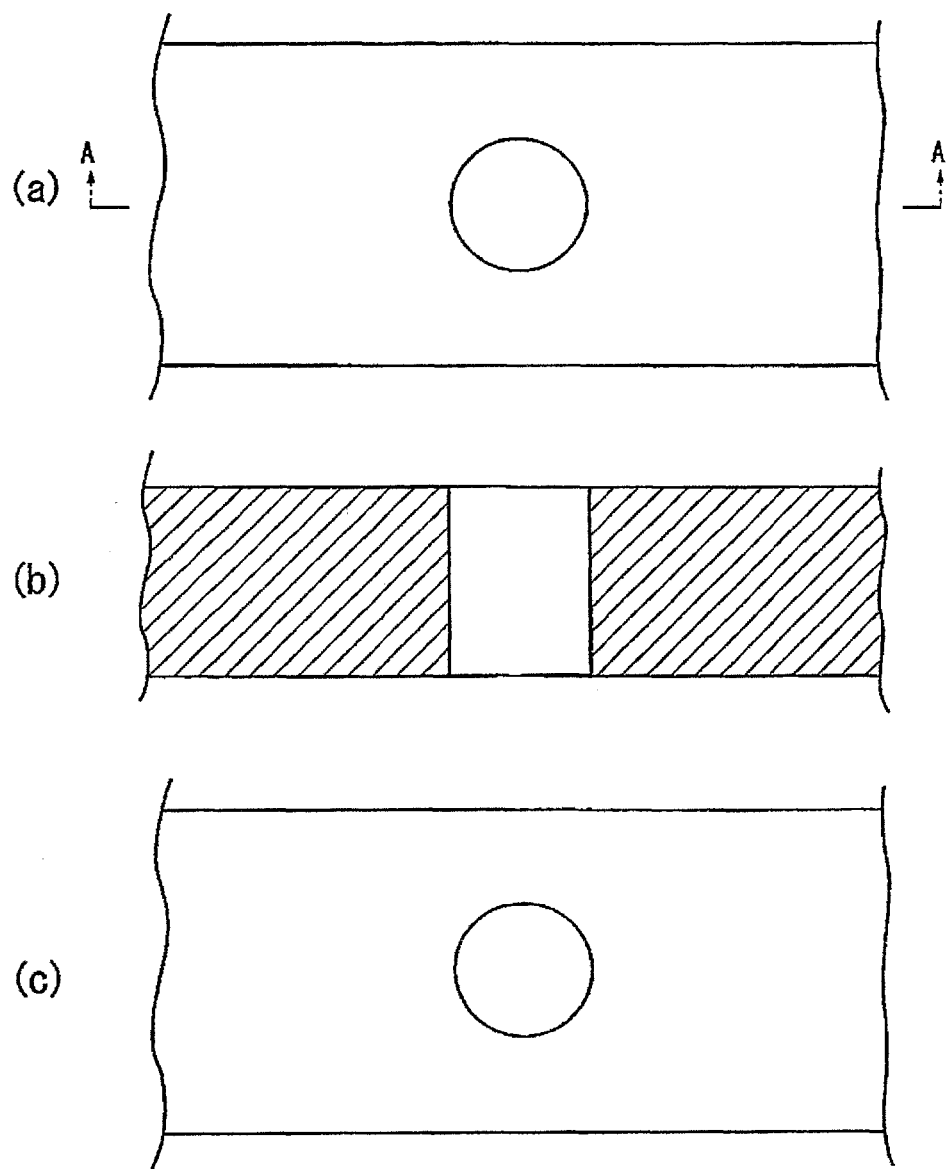
FIG. 7 is an outline partial enlarged view schematically showing the area around an atmospheric pressure adjustment hole of a pellicle frame of a conventional pellicle for lithography.

The pellicle of the present invention is characterized in that the inner peripheral face of one or more atmospheric pressure adjustment holes provided in the frame has a shape that opens out in going toward the inside of the frame in at least part of the atmospheric pressure adjustment hole, unlike in a conventional pellicle where the hole has a cylindrical shape that is straight (see FIG. 7).

Figure 2:
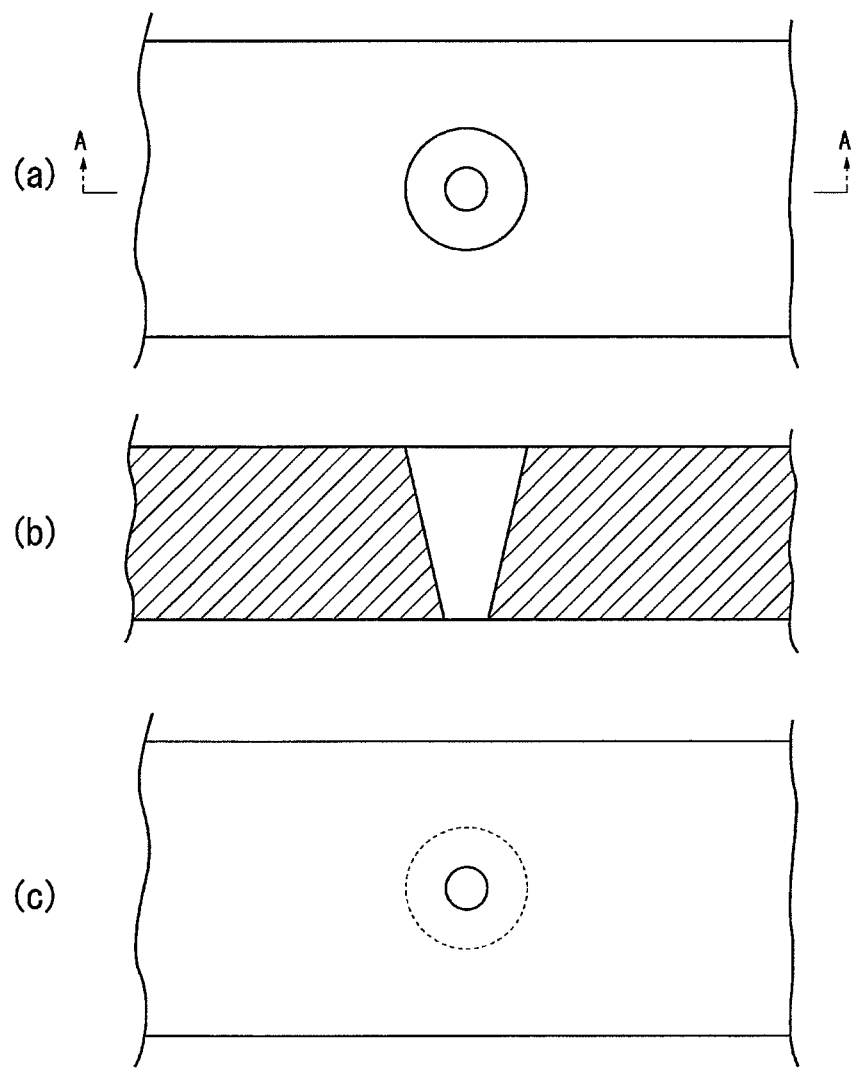
FIG. 2 is an outline partial enlarged view schematically showing the area around an atmospheric pressure adjustment hole of a pellicle frame in one embodiment of the pellicle for lithography related to the present invention. (a) shows a front view of the vicinity of the atmospheric pressure adjustment hole when viewed from inside the pellicle frame, (b) shows a sectional view of the atmospheric pressure adjustment hole at a cross-section along A-A in (a), and (c) shows a front view of the area around the atmospheric pressure adjustment hole when viewed from outside the pellicle frame. The same applies below for FIGS. 3 to 7, and (a), (b), and (c) show an inside front view, a sectional view, and an outside front view respectively.

One example of the inner peripheral face of the atmospheric pressure adjustment hole provided in the pellicle of the present invention may be, as shown in FIG. 2, a frustoconical shape that opens out uniformly and continuously over the entire length of the frame thickness in going toward the inside of the pellicle.

Figure 3:
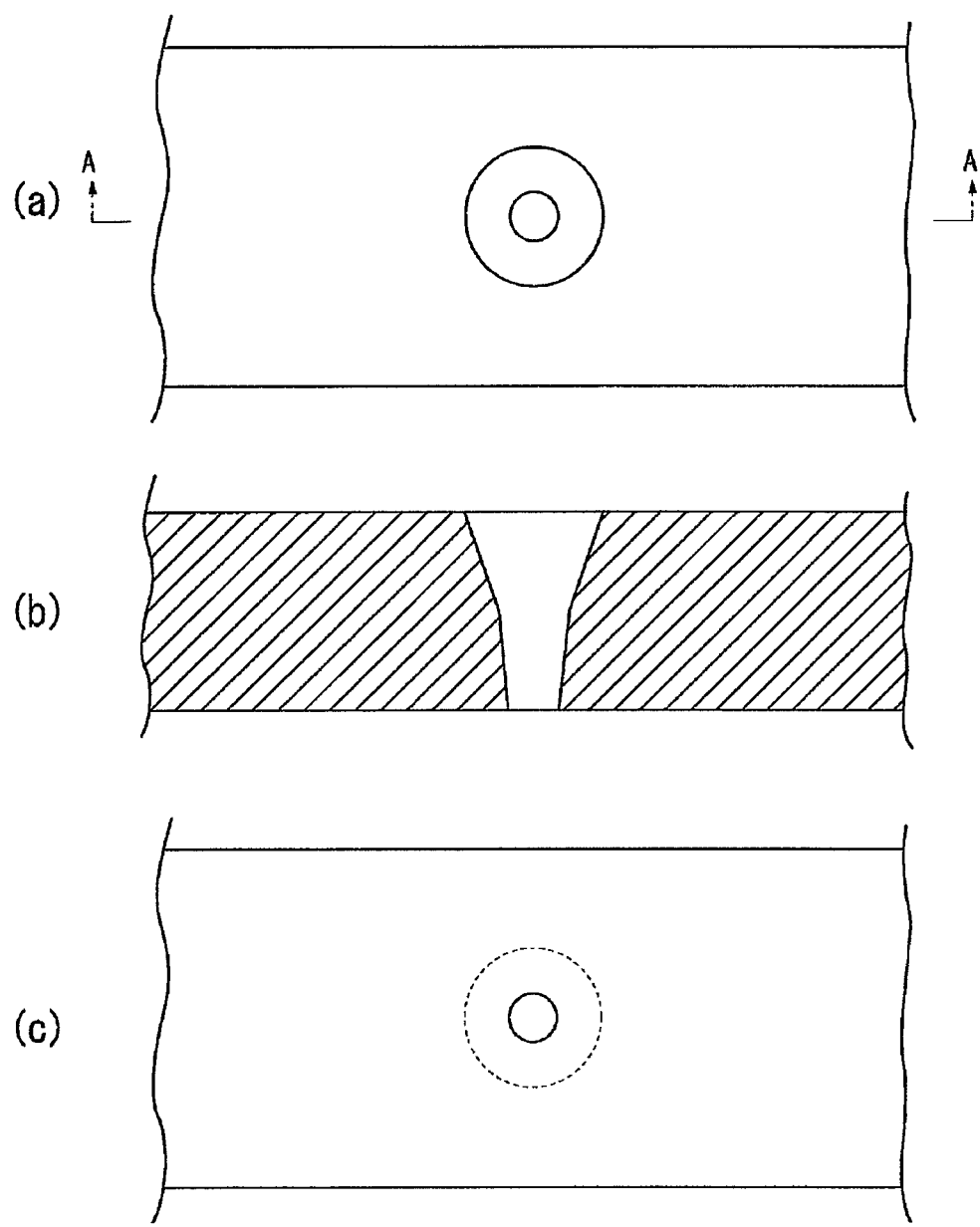
FIG. 3 is an outline partial enlarged view schematically showing the area around an atmospheric pressure adjustment hole of a pellicle frame in another embodiment of the pellicle for lithography related to the present invention.

Another example of the atmospheric pressure adjustment hole provided in the pellicle of the present invention may be, as shown in FIG. 3, a deformed frustoconical shape in which the opening-out angle increases partway along when going from the outside toward the inside.

Figure 4:
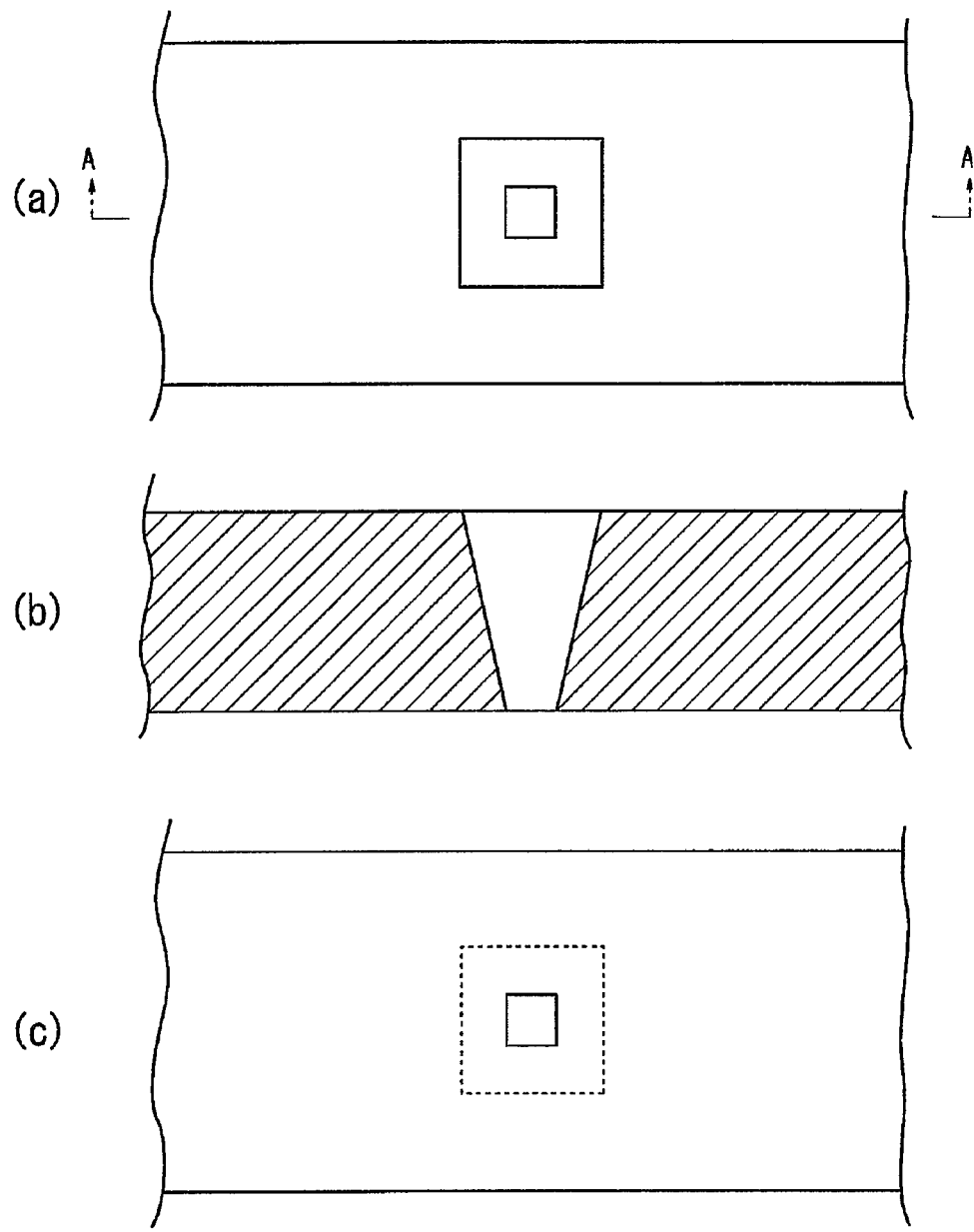
FIG. 4 is an outline partial enlarged view schematically showing the area around an atmospheric pressure adjustment hole of a pellicle frame in yet another embodiment of the pellicle for lithography related to the present invention.

Yet another example of the atmospheric pressure adjustment hole provided in the pellicle of the present invention may be, as shown in FIG. 4, a frusto-pyramidal shape in which a cross-sectional shape that is parallel to a side face of the pellicle frame is rectangular.

Figure 5:
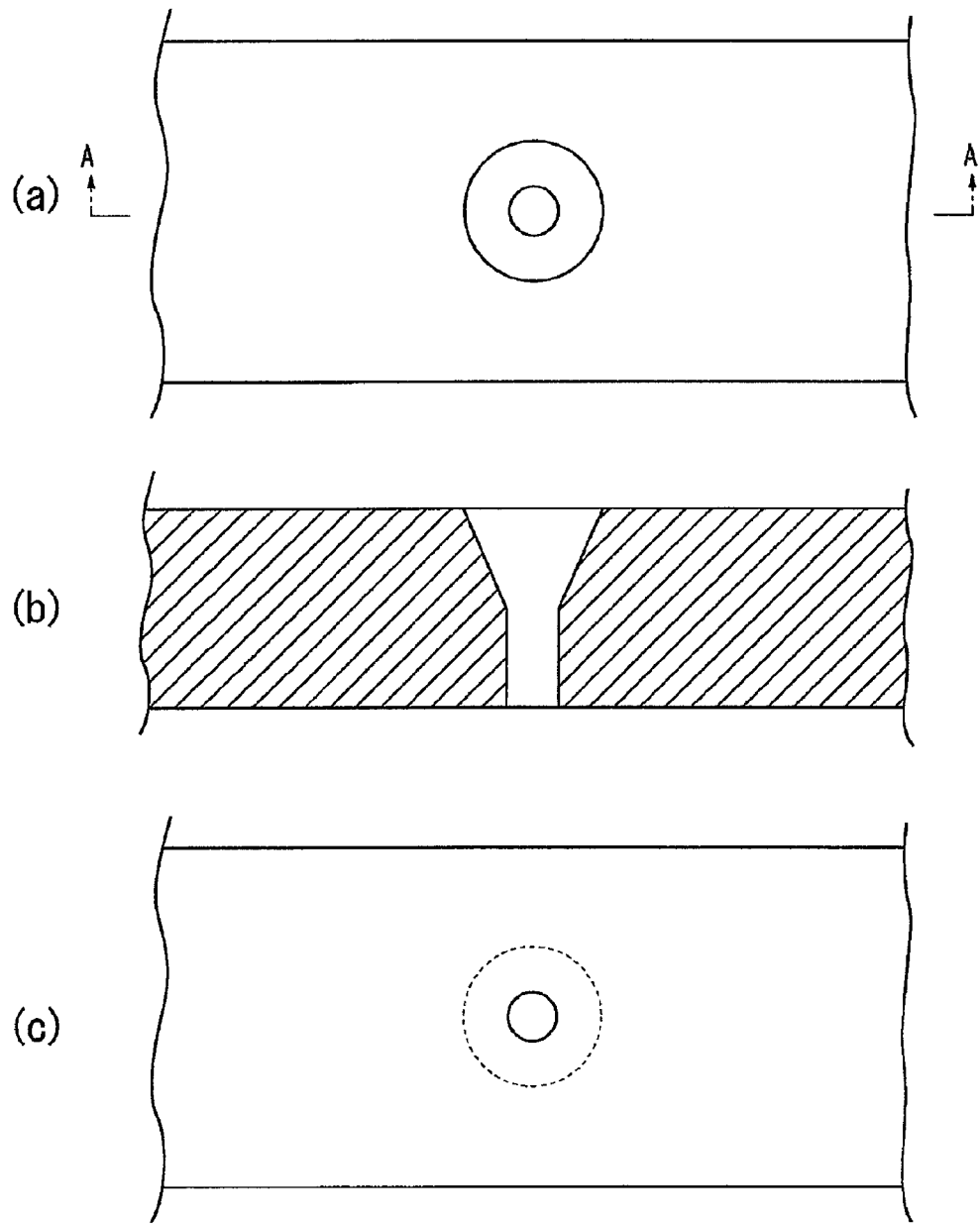
FIG. 5 is an outline partial enlarged view schematically showing the area around an atmospheric pressure adjustment hole of a pellicle frame in yet another embodiment of the pellicle for lithography related to the present invention.

Furthermore, as shown in FIG. 5, the shape of the atmospheric pressure adjustment hole may have a shape change portion in which, from the outside, it is first straight and then partway along opens out in going toward the inside, such that a cylindrical shape is connected to a cylinder. It is preferable that the conical portion is short and preferably less than 10% of the frame thickness, and it is more preferable that there is no cylindrical portion.

Figure 6:
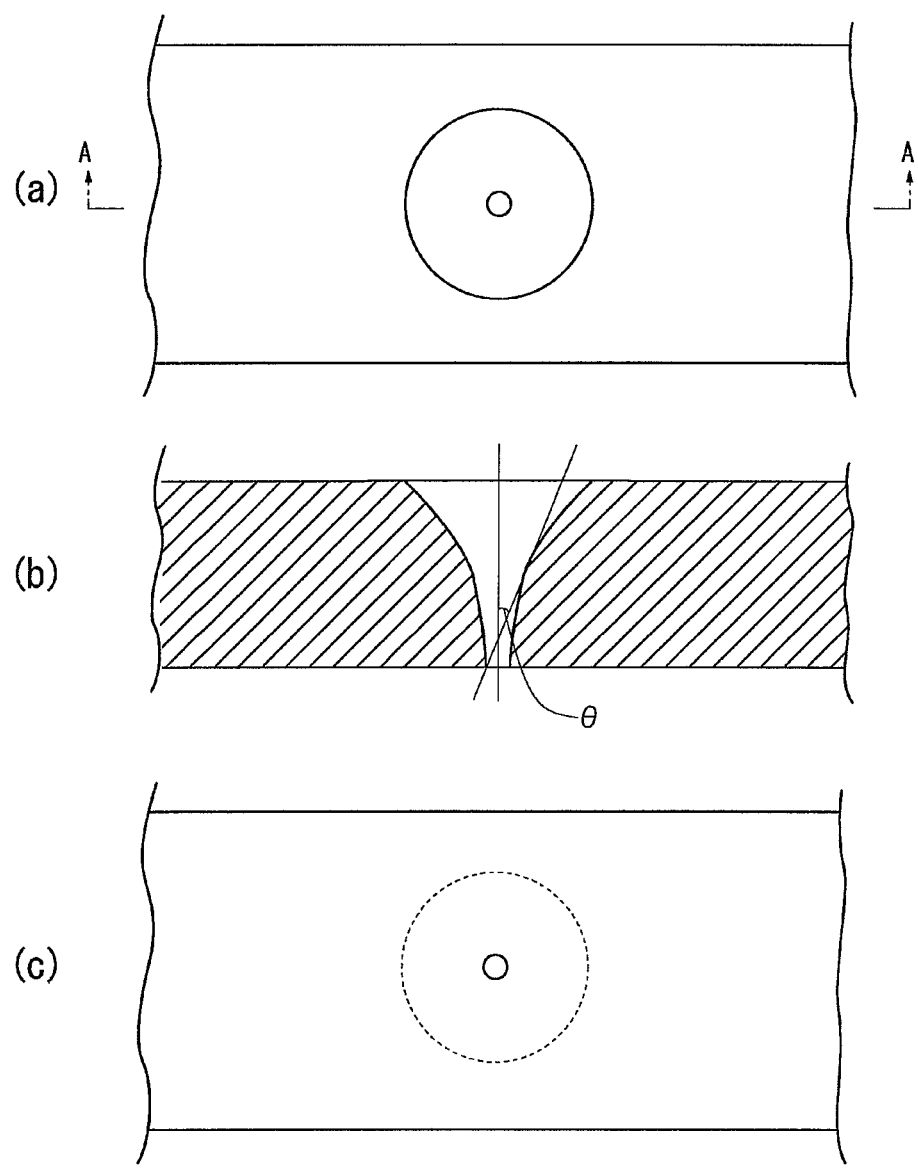
FIG. 6 is an outline partial enlarged view schematically showing the area around an atmospheric pressure adjustment hole of a pellicle frame in yet another embodiment of the pellicle for lithography related to the present invention. An angle (aperture angle) θ formed by a tangent to the surface of an inner peripheral face of the atmospheric pressure adjustment hole with respect to a perpendicular line of a cross-section at the center of the pellicle frame is shown.

Moreover, as shown in FIG. 6, it may be a trumpet shape in which the inner peripheral face of the atmospheric pressure adjustment hole opens out in going from the outside toward the inside of the frame so that the aperture angle θ continuously increases.

With regard to a specific hole diameter of the atmospheric pressure adjustment hole, the hole diameter on the outside face of the frame is preferably 0.5 to 2.0 mmφ, and the hole diameter on the inside face of the frame is preferably 0.8 to 3.0 mmφ. It is preferable that the hole diameter is set so that there is room on the outside face of the frame for affixing a filter and the strength required for the frame is not impaired. Furthermore, with regard to the hole diameter of the atmospheric pressure adjustment hole, the hole diameter is preferably 0.5 to 2.0 mmφ from the middle in the thickness direction of the frame to the outside, and the hole diameter is preferably 0.8 to 3.0 mmφ from the middle in the thickness direction of the frame to the inside.

The atmospheric pressure adjustment hole provided in the frame of the present invention preferably has a pressure-sensitive adhesive layer on its inner peripheral face. This pressure-sensitive adhesive layer may be provided by various methods, but spray-coating a pressure-sensitive adhesive composition is preferable. In the case of spray coating, the inner peripheral face of the atmospheric pressure adjustment hole can be coated with the pressure-sensitive adhesive relatively uniformly. When carrying out spray coating, suction may be carried out from the outside face.

Furthermore, with regard to the pressure-sensitive adhesive composition, a silicone pressure-sensitive adhesive is preferable, and a spray type is more preferable. As the silicone pressure-sensitive adhesive, a commercial product (KR3700, X92-183) manufactured by Shin-Etsu Chemical Co., Ltd., etc. may be used.

The atmospheric pressure adjustment hole takes on an important role when, after a pellicle is affixed to a mask, a closed space formed by affixing the pellicle is flushed with clean air. Moreover, it exhibits a function of relieving atmospheric pressure variation occurring, after a pellicle is affixed, when a mask substrate is transported by air, etc.

When the atmospheric pressure adjustment hole functions effectively as described above, a gas passes through the atmospheric pressure adjustment hole to some extent. In this process, if foreign matter such as particles is present in the interior of the atmospheric pressure adjustment hole, the foreign matter might be fed into the interior of the pellicle closed space.

Conventionally also, in order to prevent the above-mentioned problem, precision cleaning of the pellicle frame, blow cleaning of the pellicle using an air gun, a pressure-sensitive adhesive coating on the pellicle inner peripheral face, etc. are carried out. However, the size of the atmospheric pressure adjustment hole of the pellicle is typically 0.5 mmφ. Because of this there occur to some extent problems such as, in the case of precision cleaning, the possibility of gas remaining in the interior of the atmospheric pressure adjustment hole and ultrasonic cleaning not being carried out sufficiently and, furthermore, in the case of a pressure-sensitive adhesive coating on the inner peripheral face, even when spray coating is carried out from inside the frame, with the diameter of the atmospheric pressure adjustment hole being small, the possibility of uncoated areas remaining within the hole.

By enlarging the aperture of the atmospheric pressure adjustment hole on the inside of the pellicle as in the pellicle of the present invention, when a tacky resin composition is applied by means of a spray, etc. from inside the frame, it is possible to also reliably coat the inner peripheral face of the atmospheric pressure adjustment hole and suppress the frequency of occurrence of the above-mentioned problems.

Specifically, when the cross-section of the atmospheric pressure adjustment hole is circular, a frame in which the diameter on the inside face of the frame is approximately 2.0 mm, the diameter on the outside face of the frame is approximately 0.5 mm, and the inner peripheral face of the atmospheric pressure adjustment hole continuously and uniformly enlarges toward the inside of the frame can be illustrated (see FIG. 2). Furthermore, when the cross-section of the atmospheric pressure adjustment hole is triangular or rectangular, in the case of, for example, a square (see FIG. 4), it may be a shape in which the length of one side is increased from approximately 0.5 mm to approximately 2.0 mm for opposite side faces of the frame.

In the case of the cross-sectional shape of the atmospheric pressure adjustment hole being either a circle or a square, when a tacky resin composition is applied from inside the pellicle frame by spray coating, the dry thickness of the pressure-sensitive adhesive within the atmospheric pressure adjustment hole is on average 18 μm, and it is easy to ensure that the thickness is approximately 9 μm for the thinnest portion close to the outside face.

When a conventional frame (atmospheric pressure adjustment hole having a cylindrical shape with a diameter of 0.5 mmφ, see FIG. 7) is spray-coated with a pressure-sensitive adhesive resin composition from inside the frame in the same manner as above, the thickness of the pressure-sensitive adhesive coating on the inner peripheral face of the atmospheric pressure adjustment hole is a maximum of approximately 5 μm in the vicinity of an inlet close to the inside of the frame, gradually decreases, and is less than 1 μm in the vicinity of the middle of the frame thickness of approximately 2 mm. Furthermore, in the vicinity of an outlet on the outside face of the frame the inside of the atmospheric pressure adjustment hole is hardly coated at all with the pressure-sensitive adhesive resin.

The greater the inclination with which the inside face of the atmospheric pressure adjustment hole opens out in going toward the inside of the frame, the more uniform and the greater the thickness of the pressure-sensitive adhesive resin coated on the inner peripheral face of the atmospheric pressure adjustment hole tends to be when coating with the pressure-sensitive adhesive resin composition is carried out from inside the frame.

As long as the inner peripheral face of the atmospheric pressure adjustment hole is inclined to some extent in the direction in which it opens out in going toward the inside of the frame, there may be a boundary line partway along at which the inclination changes. The inclination angle of opening out in going toward the inside of the pellicle frame in the atmospheric pressure adjustment hole is preferably at least 2°, more preferably 2° to 45°, yet more preferably 5° to 45°, and particularly preferably 10° to 25°. Furthermore, the cross-sectional shape of the atmospheric pressure adjustment hole on a face that is perpendicular to the thickness direction of the pellicle frame is, as described above, not necessarily circular but may be triangular, tetragonal, or hexagonal.

The present invention is explained below more specifically by reference to Examples. A 'mask' in the Examples and Comparative Examples is illustrated as an example of the 'exposure master plate' and, needless to say, application to a reticle can be carried out in the same manner.

EXAMPLE 1

As a pellicle frame, a black-anodized duralumin frame was prepared so that the frame outer dimensions were 150 mm×122 mm×5.8 mm and the frame thickness was 2 mm. One atmospheric pressure adjustment hole was provided in the middle of a short side of the frame. The shape of the atmospheric pressure adjustment hole was a frustoconical shape, 2 mmφ on the inside face of the frame and 0.5 mmφ on the outside face, and inclined so as to gradually become smaller at a constant rate in going toward the outside (see FIG. 2). In other words, this atmospheric pressure adjustment hole had a shape in which its inner peripheral face opens out in going toward the inside of the frame. This shape was also employed in Examples 2 to 6 below.

After this frame was precision-cleaned, the entire inside face of the frame was spray-coated with a silicone pressure-sensitive adhesive (product name: KR3700) manufactured by Shin-Etsu Chemical Co., Ltd., thus forming a pressure-sensitive adhesive layer on the inner peripheral face. Subsequently, a silicone pressure-sensitive adhesive for use in reticle fitting (X40-3122) manufactured by Shin-Etsu Chemical Co., Ltd. was line-dispensed on a frame lower end face by a robot coating machine. Furthermore, a fluorine resin for pellicle film adhesion (CYTOP CTX-109A) manufactured by Asahi Glass Co., Ltd. was line-dispensed on an upper end face on the opposite side by a robot and heated using a high-frequency induction heater. Finally, an atmospheric pressure adjustment hole filter was affixed so as to cover the atmospheric pressure adjustment hole, thus completing the pellicle frame.

A pellicle film prepared in advance was adhered to the frame thus completed, thereby completing a pellicle.

The pellicle thus completed was adhered to a 12 inch silicon wafer, this was then stored in a pressure variation chamber, and an atmospheric pressure variation cycle of pressure reduction from normal pressure to 0.5 atm. and pressure recovery from 0.5 atm. to normal pressure was repeated five times. In this process, the pressure reduction from normal pressure to 0.5 atm. was carried out over 10 minutes in order to protect the pellicle film.

After the pressure variation cycle test was completed, when a foreign matter test was carried out for the inside area of the 12 inch silicon wafer that was protected by the pellicle, it was found that there was no increase in foreign matter.

Furthermore, after the test was completed, the pellicle was peeled off from the silicon wafer, a portion of the frame atmospheric pressure adjustment hole was sectioned, and when the thickness of the silicone pressure-sensitive adhesive coating on the inner peripheral face of the atmospheric pressure adjustment hole was measured, it was found that the thickness of the thinnest portion in the interior of the atmospheric pressure adjustment hole was approximately 9 μm and the thickness on the inside face of the frame was approximately 18 μm. The inner peripheral face of the atmospheric pressure adjustment hole was coated with a necessary thickness of the pressure-sensitive adhesive layer.

EXAMPLE 2

A duralumin frame that was the same as that in Example 1 was prepared. One atmospheric pressure adjustment hole was provided in the middle of a short side of the frame. The frame was prepared in exactly the same manner as in Example 1 except that the shape of the atmospheric pressure adjustment hole was a frustoconical shape, 3.0 mmφ on the inside face of the frame and 2.0 mmφ on the outside face, and inclined so as to gradually become smaller at a constant rate in going toward the outside (see FIG. 2), and a pellicle was completed in the same manner as in Example 1 using this frame.

After the same atmospheric pressure variation cycle test as in Example 1 was completed, when an inspection was carried out for the inside area of the 12 inch silicon wafer that was protected by the pellicle, it was found that there was no increase in foreign matter.

After the measurement, the pellicle was peeled off from the silicon wafer, and when the thickness of the silicone pressure-sensitive adhesive coating was measured in the same manner as in Example 1, it was found that the thickness of the thinnest portion in the interior of the atmospheric pressure adjustment hole was approximately 10 μm and the thickness on the inside face of the frame was approximately 18 μm. The inner peripheral face of the atmospheric pressure adjustment hole was coated with a necessary thickness of the pressure-sensitive adhesive layer.

EXAMPLE 3

A duralumin frame that was the same as that in Example 1 was prepared. One atmospheric pressure adjustment hole was provided in the middle of a short side of the frame. The shape of the atmospheric pressure adjustment hole was a frustoconical shape, 0.8 mmϕ on the inside face of the frame and 0.5 mmϕ on the outside face, and inclined so as to gradually become smaller at a constant rate in going toward the outside (see FIG. 2). A pellicle was completed in the same manner as in Example 1 using this frame.

After the same atmospheric pressure variation cycle test as in Example 1 was completed, when an inspection was carried out for the inside area of the 12 inch silicon wafer that was protected by the pellicle, it was found that there was no increase in foreign matter.

When the thickness of the silicone pressure-sensitive adhesive layer was measured in the same manner as in Example 1, it was found that the thickness of the thinnest portion on the inner peripheral face of the atmospheric pressure adjustment hole was approximately 3 μm and the thickness on the inside face of the frame was approximately 18 μm. The inner peripheral face of the atmospheric pressure adjustment hole was coated with a necessary thickness of the pressure-sensitive adhesive layer.

EXAMPLE 4

A duralumin frame that was the same as that in Example 1 was prepared. One atmospheric pressure adjustment hole was provided in the middle of a short side of the frame. The shape of the atmospheric pressure adjustment hole was as shown in FIG. 3, the hole being inclined so as to gradually become smaller at constant rates for a section from the inside face to a depth of 1 mm and a section from a depth of 1 mm to the outside outlet so that it was 3.0 mmϕ on the inside face of the frame side, 1.5 mmϕ in a portion at a depth of 1 mm, and 1.0 mmϕ on the outside face side. That is, there was a boundary line on the face in the portion at a depth of 1 mm. A pellicle was completed in the same manner as in Example 1 except that this frame was used.

After the same atmospheric pressure variation cycle test as in Example 1 was completed, when an inspection was carried out for the inside area of the 12 inch silicon wafer that was protected by the pellicle, it was found that there was no increase in foreign matter.

When the thickness of the silicone pressure-sensitive adhesive layer coating on the inner peripheral face of the atmospheric pressure adjustment hole was measured in the same manner as in Example 1, it was found that the thickness of the thinnest portion in the interior of the atmospheric pressure adjustment hole was approximately 8 μm and the thickness on the inside face of the frame was approximately 18 μm. The inner peripheral face of the atmospheric pressure adjustment hole was coated with a necessary thickness of the pressure-sensitive adhesive layer.

EXAMPLE 5

A duralumin frame that was the same as that in Example 1 was prepared. One atmospheric pressure adjustment hole was provided in the middle of a short side of the frame. The shape of the atmospheric pressure adjustment hole was a square with a side of 2.0 mm on the inside face of the frame side and a square with a side of 0.8 mm on the outside face side, the hole being inclined so as to gradually become smaller at a constant rate in going toward the outside (see FIG. 4). A pellicle was completed in the same manner as in Example 1 using this frame.

After the same atmospheric pressure variation cycle test as in Example 1 was completed, when an inspection was carried out for the inside area of the 12 inch silicon wafer that was protected by the pellicle, it was found that there was no increase in foreign matter.

When the thickness of the silicone pressure-sensitive adhesive coating on the inner peripheral face of the atmospheric pressure adjustment hole was measured in the same manner as in Example 1, it was found that the thickness of the thinnest portion in the interior of the atmospheric pressure adjustment hole was approximately 8 μm and the thickness on the inside face of the frame was approximately 18 μm. The inner peripheral face of the atmospheric pressure adjustment hole was coated with a necessary thickness of the pressure-sensitive adhesive layer.

EXAMPLE 6

A duralumin frame that was the same as that in Example 1 was prepared. One atmospheric pressure adjustment hole was provided in the middle of a short side of the frame. The shape of the atmospheric pressure adjustment hole was 2.0 mmϕ on the inside face of the frame side, 1.0 mmϕ for a portion at a depth of 1 mm, and 1.0 mmϕ on the outside face side, the hole being inclined so as to gradually become smaller at a constant rate for a section from the inside face to a depth of 1 mm. The diameter was constant from the portion at a depth of 1 mm to the outlet on the outside face. That is, there was a boundary line on the face in the portion at a depth of 1 mm (see FIG. 5). A pellicle was completed in the same manner as in Example 1 using this frame.

After the same atmospheric pressure variation cycle test as in Example 1 was completed, when an inspection was carried out for the inside area of the 12 inch silicon wafer that was protected by the pellicle, it was found that there was one piece of foreign matter around the atmospheric pressure adjustment hole.

When the thickness of the silicone pressure-sensitive adhesive coating was measured in the same manner as in Example 1, it was found that it was approximately 18 μm on the inside face of the frame, but in the interior of the atmospheric pressure adjustment hole it was 0.3 μm in the vicinity of the inlet on the inside face and approximately 0.1 μm in the vicinity of the outlet on the outside face, which was thin. Since the pressure-sensitive adhesive coating in the interior of the atmospheric pressure adjustment hole was not sufficient in an area from a depth of 1 mm to the outside face, there was a high possibility of generating particulates in the atmospheric pressure variation cycle test.

COMPARATIVE EXAMPLE 1

A duralumin frame that was the same as that in Example 1 was prepared. One atmospheric pressure adjustment hole was provided in the middle of a short side of the frame. The shape of the atmospheric pressure adjustment hole was 2.0 mmϕ and it was machined so as to extend through a frame thickness of 2 mm (see FIG. 7). A pellicle was completed in the same manner as in Example 1 using this frame.

After the same atmospheric pressure variation cycle test as in Example 1 was completed, when an inspection was carried out for the inside area of the 12 inch silicon wafer that was protected by the pellicle, it was found that there were three pieces of foreign matter around the atmospheric pressure adjustment hole.

When the thickness of the silicone pressure-sensitive adhesive coating on the inner peripheral face of the atmospheric pressure adjustment hole was measured in the same manner as in Example 1, it was found that it was approximately 18 μm on the inside face of the frame, 0.3 μm in the vicinity of the inlet of the atmospheric pressure adjustment hole on the inside, and only 0.02 μm in the vicinity of the outlet on the outside. Since the inner peripheral face of the atmospheric pressure adjustment hole was not coated with a necessary thickness of the pressure-sensitive adhesive layer, there was a high possibility of generating particulates in the atmospheric pressure variation cycle test.

COMPARATIVE EXAMPLE 2

A duralumin frame that was the same as that in Example 1 was prepared. One atmospheric pressure adjustment hole was provided in the middle of a short side of the frame. The shape of the atmospheric pressure adjustment hole was a 0.5 mmϕ cylinder and it was machined so as to extend through a frame thickness of 2 mm (see FIG. 7). A pellicle was completed in the same manner as in Example 1 using this frame.

After the same atmospheric pressure variation cycle test as in Example 1 was completed, when an inspection was carried out for the inside area of the 12 inch silicon wafer that was protected by the pellicle, it was found that there were three pieces of foreign matter around the atmospheric pressure adjustment hole.

After the measurement, the pellicle was peeled off from the silicon wafer, a portion of the frame atmospheric pressure adjustment hole was sectioned, and when the coating of silicone pressure-sensitive adhesive in the interior of the atmospheric pressure adjustment hole was measured, it was found that, although the thickness was approximately 18 μm on the inside face of the frame, in the interior of the atmospheric pressure adjustment hole it was approximately 0.2 μm in the vicinity of the inlet on the inside face and only approximately 0.01 μm in the vicinity of the outlet on the outside face. Since the inner peripheral face of the atmospheric pressure adjustment hole was not coated with a necessary thickness of the pressure-sensitive adhesive layer, there was a high possibility of generating particulates in the atmospheric pressure variation cycle test.

With regard to the pellicle used in the above-mentioned verification experiments, two types of pellicles with frame heights of 5.8 mm and 3.5 mm were used, and it can be expected that the upper limit for the hole diameter would be on the order of 3.0 mmϕ and 2 mmϕ respectively while taking into consideration the frame strength.

In the case of a frame size other than the above, the upper limit for the hole diameter on the inner face side of the atmospheric pressure adjustment hole may be determined as appropriate according to the frame height. At the same time, the lower limit for the hole diameter may be approximately 0.3 mmϕ while taking into consideration the degree of ease of hole machining and stability.

What is claimed is:

1. A pellicle for lithography comprising a pellicle frame provided with one or more atmospheric pressure adjustment holes each having an inner peripheral face and extending from an outside face to an inside face of the pellicle frame, wherein an entirety of each hole widens toward the inside face of the pellicle frame such that every line tangential to the inner peripheral face forms an angle of 2 degrees or greater with respect to a line perpendicular to the inside face of the pellicle frame.

2. The pellicle for lithography according to claim 1, wherein each of the one or more atmospheric pressure adjustment holes has a pressure-sensitive adhesive layer on the inner peripheral face.

3. The pellicle for lithography according to claim 1, wherein the inner peripheral face of each of the one or more atmospheric pressure adjustment holes has a shape that opens out so as to be continuous with the inside face of the pellicle frame.

4. The pellicle for lithography according to claim 1, wherein the pellicle frame is provided on the outside face with a dust filter so as to cover each of the one or more atmospheric pressure adjustment holes.

5. The pellicle for lithography according to claim 1, wherein a first hole diameter of each atmospheric pressure adjustment hole on the inside face of the pellicle frame is larger than a second hole diameter of each atmospheric pressure adjustment hole on the outside face of the pellicle frame, the second hole diameter of each atmospheric pressure adjustment hole on the outside face of the pellicle frame being 0.5 to 2.0 mm, and the first hole diameter of each atmospheric pressure adjustment hole on the inside face of the pellicle frame being 0.8 to 3.0 mm.

6. The pellicle for lithography according to claim 1, wherein the angle is 2° to 45°.

7. The pellicle for lithography according to claim 1, wherein a third hole diameter of each atmospheric pressure adjustment hole at a cross-section that is perpendicular to a thickness direction of the pellicle frame is larger than a second hole diameter of each atmospheric pressure adjustment hole on the outside face of the pellicle frame for at least 90% of the thickness direction of the pellicle frame.

8. A process for producing a pellicle for lithography, the process comprising:
    of forming the pellicle for lithography according to claim 1; and
    a step of spray-coating a pressure-sensitive adhesive composition from inside the pellicle frame.

9. The pellicle for lithography according to claim 6, wherein the angle is 5 degrees to 25 degrees.

* * * * *